US00RE34843E

United States Patent [19]

Ferguson

[11] E Patent Number: Re. 34,843

[45] Reissued Date of Patent: Jan. 31, 1995

[54] SIGNAL CONTROLLED WAVEFORM RECORDER

[75] Inventor: Hugo S. Ferguson, Averill Park, N.Y.

[73] Assignee: Duffers Scientific, Inc., Poestenkill, N.Y.

[21] Appl. No.: 288,029

[22] Filed: Dec. 20, 1988

Related U.S. Patent Documents

Reissue of:

[64] Patent No.: 4,631,697
Issued: Dec. 23, 1986
Appl. No.: 676,915
Filed: Nov. 30, 1984

U.S. Applications:

[63] Continuation-in-part of Ser. No. 522,356, Aug. 11, 1983, abandoned.

[51] Int. Cl.[6] ..... G06F 3/05; G06F 3/06

[52] U.S. Cl. ..... 360/5; 369/19

[58] Field of Search ... 364/200 MS File, 900 MS File; 324/73 R, 73 AT; 360/5; 369/19

[56] References Cited

U.S. PATENT DOCUMENTS

| | | | |
|---|---|---|---|
| 3,225,333 | 12/1965 | Vinal | 340/146.2 |
| 3,344,406 | 9/1967 | Vinal | 364/900 |
| 3,629,855 | 12/1971 | Conley | 364/900 |
| 3,843,893 | 10/1974 | Terry | 307/87 |
| 4,110,564 | 8/1978 | Andresen | 328/13 |
| 4,110,684 | 8/1978 | Gale | 324/52 |
| 4,195,258 | 3/1980 | Yen | 324/73 AT |
| 4,271,486 | 6/1981 | Dagostino et al. | 365/45 |
| 4,311,960 | 1/1982 | Barr | 324/103 P |
| 4,364,036 | 12/1982 | Shimizu | 340/715 |
| 4,399,512 | 8/1983 | Soma et al. | 364/487 |
| 4,425,643 | 1/1984 | Chapman et al. | 371/20 |
| 4,513,395 | 4/1985 | Henry et al. | 364/900 |
| 4,541,100 | 9/1985 | Sutton et al. | 375/10 |

FOREIGN PATENT DOCUMENTS 2113507 8/1983 United Kingdom .

OTHER PUBLICATIONS

Dedinas, "Advanced Waveform Recorders Do More Than Capture Transients", EDN, Sep. 5, 1978, pp. 103–110.

Kemp, "Portable Minicomputer/Modem System for Collecting Field Data", 1977 Power Industry Computer Applications Conference, pp. 403–406.

Kajihara, "Power Transient Monitor", IEEE Transactions on Instrumentation and Control, Feb. 1972, pp. 74–77.

Anderholm, "Time-Tag Generator for Variable Sampling Rate Analog-to-Digital Converter", IBM Technical Disclosure Bulletin, vol. 8, No. 11, Apr. 1966, pp. 1520–1521.

*Primary Examiner*—Kevin A. Kriess
*Attorney, Agent, or Firm*—Peter L. Michaelson

[57] ABSTRACT

A multi-channel electronic waveform recorder, for storing waveform data and time of occurrence information, i.e., a "time-tag", for each stored value of an input waveform, is disclosed. Specifically, each channel of the waveform recorder compares a previously stored value of a corresponding input signal to a current value *of that signal*, and [stores] *is able to store* the current value whenever the difference between the input signal and the previously stored value is a predetermined amount. *Each or any selected sub-set of all the channels, through an appropriate switch setting, can determine points in time when, in response to the difference occurring for that channel, all the channels will simultaneously store the current value of these respective input signals.*

15 Claims, 5 Drawing Sheets

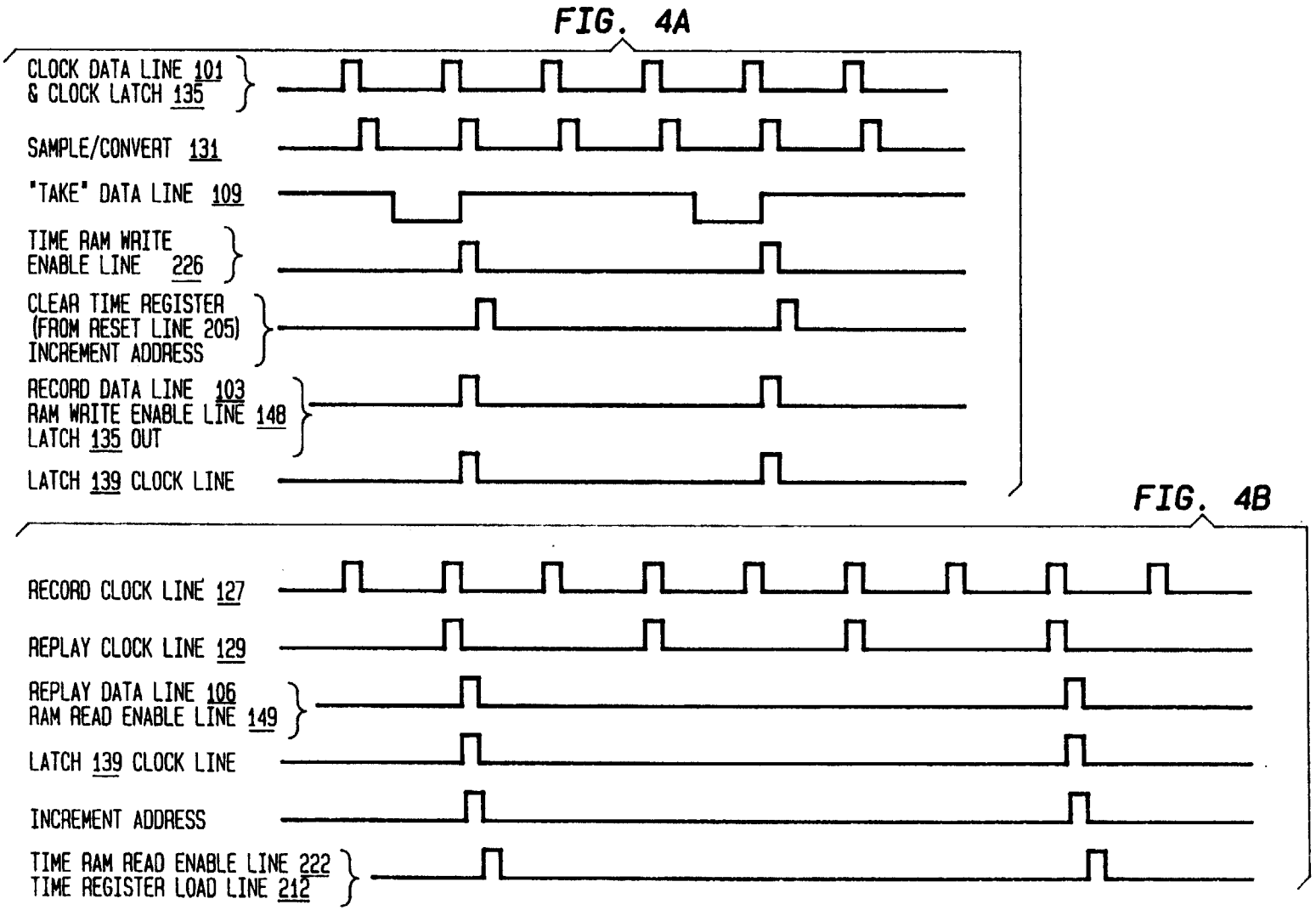
FIG. 4A
CLOCK DATA LINE 101
& CLOCK LATCH 135
SAMPLE/CONVERT 131
"TAKE" DATA LINE 109
TIME RAM WRITE
ENABLE LINE 226
CLEAR TIME REGISTER
(FROM RESET LINE 205)
INCREMENT ADDRESS
RECORD DATA LINE 103
RAM WRITE ENABLE LINE 148
LATCH 135 OUT
LATCH 139 CLOCK LINE
FIG. 4B
RECORD CLOCK LINE 127
REPLAY CLOCK LINE 129
REPLAY DATA LINE 106
RAM READ ENABLE LINE 149
LATCH 139 CLOCK LINE
INCREMENT ADDRESS
TIME RAM READ ENABLE LINE 222
TIME REGISTER LOAD LINE 212

| INPUT DATA | OUTPUT P-Q |
|---|---|
| P=Q | H |
| P>Q | L |
| P<Q | L |

SIGNAL CONTROLLED WAVEFORM RECORDER

Matter enclosed in heavy brackets [ ] appears in the original patent but forms no part of this reissue specification; matter printed in italics indicates the additions made by reissue.

CROSS-REFERENCE TO RELATED APPLICATION

This application is a *reissue of U.S. Pat. No. 4,631,697 which is a* continuation-in-part of U.S. patent application Ser. No. 522,356, filed Aug. 11, 1983, *now abandoned.*

BACKGROUND OF THE INVENTION

1. Field of the Invention

The invention relates to electronic waveform recorders and, more particularly, to those that can record a plurality of analog or digital signals and can be triggered to record these signals in response to a change occurring in any one of these signals.

2. Description of the Prior Art

The development and maintenance of any digital system often requires initial and on-going analysis of a variety of digital signals; some of which represent inputs to the system, some of which are internal signals, and the remainder representing outputs generated by the system. However, for a variety of reasons, such an analysis can rarely be undertaken immediately upon the occurrence of any of these signals. Chief among these reasons is that any digital signal may exist for only a relatively short period of time and/or may occur only once *or* on an infrequent basis. In addition, some digital signals, which are related in time may occur only at widely varying times.

Consequently, a variety of electrical devices have commercially appeared or at least have been proposed in the art for recording digital signals, i.e., digital signal patterns, for subsequent use in, for example, system analysis. Generally, these devices fall into two broad classes: oscilloscopes, and electronic recorders. Unfortunately, each class possesses a unique drawback which limits its utility.

Specifically, oscilloscopes rely on repetitive input signals, i.e., waveforms, to obtain a bright image. Recent advances involving storage oscilloscopes involve the incorporation of high speed memories for recording high speed pulses and also for replaying [the] recorded waveforms so as to obviate the need for repetitive application of these pulses to an input to the oscilloscope. However, the memory disadvantageously complicates the use of the oscilloscope and, due to its restricted capacity, limits the use of storage oscilloscopes in applications involving the recording of multiple signals occurring at widely varying times.

Another limiting feature of an oscilloscope is its restricted time base. In many current digital circuit designs, pulse widths in the microsecond range are commonplace and pulse widths on the order of several nanoseconds are often being increasingly used. Furthermore, infrequently occurring widely spaced pulses, having such an extremely narrow pulse width and which may in fact have a pulse spacing as wide as several seconds, are also quite common in current digital circuits. However, whenever a storage oscilloscope is set to record such a narrow pulse, the fastest usable total sweep time might be on the order of 10 microseconds. A longer sweep would make a nanosecond pulse so narrow as to be unobservable. The use of presently existing extremely high speed (100 171 nanosecond] *nanoseconds*) delayed sweeps is only partially able to rectify this, since only one such sweep across the screen of the oscilloscope is usually available upon the occurrence of an input pulse. Hence storage oscilloscopes are only useful for examining and/or storing each separate pulse and/or adjacent pulses closely occurring in time. Consequently, storage oscilloscopes are generally disadvantageously unable to record pulses having a plurality of widths in the microsecond to nanosecond region with time delays between adjacent pulses extending more than several orders of magnitude greater.

Electronic recorders, on the other hand, rely on storing data in a digital memory by ["clocking" the] *sampling an* incoming signal at pre-selected time intervals *and storing each resulting sample.* The stored [signal] *samples* can be subsequently retrieved for processing and/or display. Such a recorder, when used in conjunction with an oscilloscope allows the display of an infrequently occurring pulse by repetitively retrieving (replaying) [the recorded pulse waveshape] *its stored samples* from the memory in order to produce a desired trace *of the waveform of the pulse.* Unfortunately, these digital memories, due to their limited capacities, can only accommodate signals occurring over extremely short time spans. Hence, a plurality of infrequently occurring digital pulses having narrow pulse widths cannot be recorded by such devices.

A single bit of information is represented by two states, namely a 0 or a 1. When an analog signal is converted to digital data a plurality of bits [are] *is* used to represent the amplitude value of the analog signal. [Electronic] *As such, electronic* memories are used [for the recording of both] *to record a* digital [signals] *signal,* where only the state *of each bit in the signal* is recorded, [and] *or an* analog [signals] *signal* where [the] *an analog* waveform is [recorded using] *first converted in digital values having* a plurality of bits *in which each multi-bit value is then recorded.* The deficiencies described are found in both types of recording.

To a certain extent, these deficiencies in electronic recorders known to the art have been advantageously eliminated in the analog waveform recorder disclosed in my co-pending U.S. patent application entitled "Signal Controlled Waveform Recorder", Ser. No. 494,322, filed May 13, [1983now] *1983 now* abandoned. Unfortunately, the relatively slow speed at which the analog comparison circuitry, used in the data taking process contained therein, operates significantly and disadvantageously limits the maximum speed of the input waveforms that can be recorded. Additionally, the analog conversion circuit is slow in comparison to the times encountered in many pulse measurements. The comparison method of this invention eliminates the [deficiences] *deficiencies* and allows the recording of digital signals in the nanosecond range. Analog waveforms are also recorded in the microsecond and nanosecond ranges, limited only by the speed of [the] *an* analog conversion.

SUMMARY OF THE INVENTION

Accordingly, an object of the present invention is to provide a simple and inexpensive multi-channel electronic analog or digital recorder that is capable of accurately recording a plurality of either analog or digital waveforms.

Another object is to accurately record digital pulses having pulse widths in the microsecond to nanosecond region.

Another object is to substantially eliminate the need for an operator to have any familiarity with the period (or pulse width) of the waveform to be recorded.

A particular object is to accurately record a plurality of waveforms, each of which can have a frequency or [pulse-width] *pulse width* that widely varies from that of any other.

Another particular object is to accurately record any generally unknown and infrequently occurring waveform without requiring an excessive amount of memory.

Another object is to accurately record the time-of-occurrence of any recorded value of any of the recorded waveforms.

A further object is to allow the operator to quickly and easily vary any of the comparison criteria for any of the channels while the recorder is operating.

Another object is to provide means for reconstructing waveforms from previously stored data or from calculated time and amplitude data.

These and other objects are achieved in accordance with the present invention by periodically latching a digital input signal, providing a digital output signal having substantially the same logical value as that of a previously stored value of the digital input signal, comparing the logical values of the digital input signal and the digital output signal, and, in response to any logical difference therebetween, storing the latched value in a memory.

One embodiment of the invention utilizes an analog to digital converter to provide a plurality of bits representative of the analog signal amplitude. The plurality of corresponding bits are then identically compared and, in response to any logical difference therebetween, the latched values are stored in a memory.

The precision to which the *amplitude of the* analog [amplitude] *signal* is represented by the digital signals depends upon the number of bits compared. To store data less frequently and thereby use less memory, only the more significant bits are logically compared.

[In] *The inventive waveform recorder contains N substantially identical channels. Within any of these channels and in* accordance with a first specific embodiment disclosed herein, [a] one-bit *of a multi-bit* digital input signal is clocked into a first latch *within a corresponding data channel.* To determine whether this latched value is to be stored in a memory, illustratively random access, a selection circuit *within this data channel* compares the most recently stored value, present at the output of a second latch *also contained within this data channel,* to the then current level of the input signal. Specifically, the output of the second latch is continuously applied to one input of an exclusive NOR gate, and the current value of the input signal is applied to another input of this gate. If the levels at both inputs are different, then the NOR gate generates a "TAKE" return signal. The "TAKE" return signal is then applied to system control circuitry, [both to cause] *which, in turn, causes* the random access memory *in this and all other data channels* to store the latched value present in the first latch [and to transfer] *contained in each corresponding data channel. Thereafter, the system control circuitry also transfers* this data *from the first latch in each data channel* into the second latch *in each data channel.* Alternatively, if the levels *at both inputs* are the same, then the latched value of the digital input signal is [not] *neither* stored [or] *in the memory nor* transferred *into the second latch in any data channel.*

To provide a "tag-time" for each stored value of the input signal, a clock, which operates the first latch, is used to increment a counter *situated within the system control circuitry.* Whenever a *latched* value is stored in memory, the total count occurring at that time is stored in another memory *also situated within the system control circuitry* at an address corresponding to the location where that *latched* value is stored. As soon as the count has been stored, the contents of the counter are reset, to illustratively zero, such that the counter is able to accurately count the appropriate interval [for the] *of time that elapses until a subsequent latched value is* successively stored [value].

In accordance with a second embodiment disclosed herein, *specifically for use in recording analog signals, each data channel also contains an analog-to-digital converter and a digital-to-analog converter. Here, within any channel* an 8 bit analog to digital converter provides 8 bits of data which are clocked into a first latch. To determine whether the 8 bits representing the amplitude of the analog input signal are to be stored in memory, illustratively random access, a selection circuit compares the most recently stored values, present at the output of a second latch, to the then current level of corresponding input signals. Specifically, the outputs of the second latch are continuously applied to one set of inputs of an 8 bit [identity comparitor and the] *comparator. The* current values of the input signals from the first latch are *also* applied to [the] *a* second set of inputs of [the 8 bit identity comparitor] *this comparator.* If the levels at both inputs for any bit are different, then the [identity comparitor] *comparator* generates a "TAKE" return signal. The "TAKE" return signal is then applied to *the* system control circuitry[, both] to: (*a*) cause the random access memory *in each data channel* to store the latched value present in the first latch, *in its associated data channel* and [to] (*b*) transfer this data *from the first latch in each data channel* into the second latch *in each associated data channel.* Alternately, if the levels are the same for all corresponding bits, then no "TAKE" signal is generated and the values latched in the first latch are [not] *neither* stored [or] *in the memory nor* transferred *into the second latch in any data channel.*

Both the "tag-time" and control circuitry are similar to that described above in the first embodiment.

Advantageously, the operator need not have any knowledge of the waveform to be recorded other than to know that its effective pulse width is greater than a very small value. As noted, each channel both continuously latches its input signal and simultaneously records each desired latched value and its "tag-time" all during extremely short intervals of time, i.e., intervals which are substantially shorter than the minimum period (or pulse width) of the input signals that are likely to be recorded. Consequently, the recorder can [accuratley] *accurately* record any input signal having an extremely wide period (or pulse width) without any adjustment being made to the recorder.

[Another] *A* feature of the invention is to permit each or any selected subset of all of the channels in the waveform recorder to determine the points in time when all the channels *will* simultaneously record a value for all their respective input signals. Specifically, the "TAKE" return signal produced by data comparison in each channel is applied through a switch to the system control circuitry. All the switched "TAKE" return signals are effectively tied together. Within the system control circuitry, a resultant "TAKE" data signal is generated and applied to each channel to cause [it] *that channel* to store the current value of its respective input signal. Consequently, at the occurrence of any switched "TAKE" return signal produced by any channel, all the channels will simultaneously record data. If, however, the switch in any channel is appropriately positioned to disconnect the "TAKE" return signal generated by that channel from the system control circuitry, then that channel will record data only in response to a "TAKE" return signal generated by any other channel. Thus, all these switches can be appropriately set such that any one or more of the channels *will* determine when all the channels record data.

[It is a] *Another* feature of this invention, in its second embodiment, [to permit] *permits* the sensitivity of the recording circuitry in each channel of the waveform recorder to be set to match the expected perturbation in the input signal applied thereto. Specifically, the sensitivity of each channel is varied through the selection of the number of bits applied to the [identity comparitor] *comparator*. The least significant bits may be switchably disregarded advantageously providing the operator with complete flexibility in independently tailoring the operation of each channel in the multi-channel recorder to the particular input signal applied thereto.

Lastly, a further feature of this invention [is to provide] *provides* a multi-channel recorder that can be readily expanded to accommodate any number of channels. This is readily accomplished by essentially connecting all the channels in parallel off various control lines[,] and buses emanating from the system control circuitry.

BRIEF DESCRIPTION OF THE DRAWINGS

The invention may be clearly understood from a consideration of the following detailed description and accompanying drawings, in which:

FIGS. 4A and 4B are waveform diagrams showing typical timing relationships among various control signals occurring in the recorder during data recording and replaying operations, respectively.

To facilitate easy understanding, identical reference numerals are used to denote [identical] *similar* elements *that are* common to the figures.

DETAILED DESCRIPTION

Figure 1:
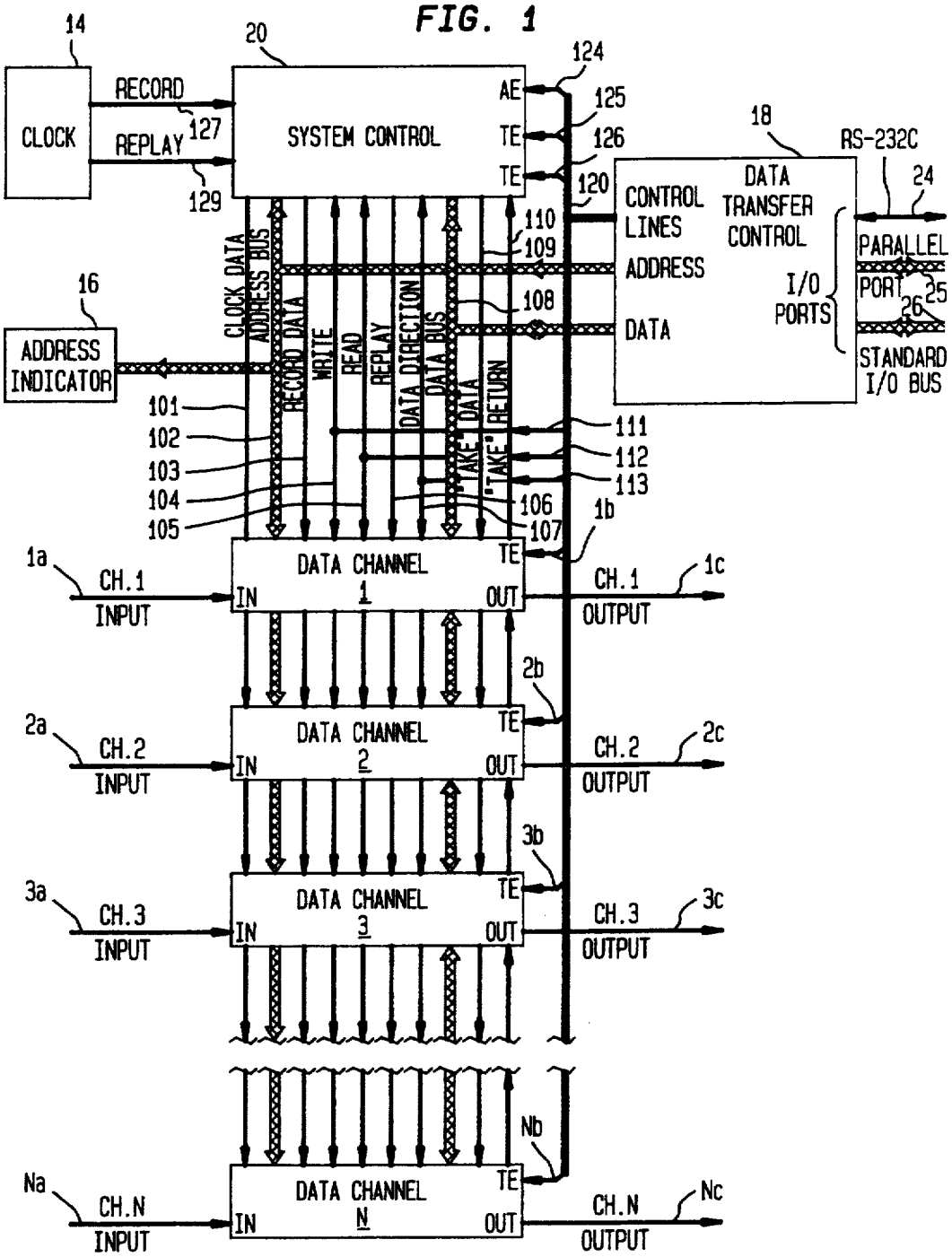
FIG. 1 is an overall block diagram of the circuitry of a multi-channel electronic digital waveform recorder which embodies the teachings of the present invention.

FIG. 1 depicts an overall block diagram of a multi-channel electronic waveform recorder which embodies the teachings of the present invention.

As shown, the waveform recorder is comprised of a plurality of N substantially identical channels; specifically data channel 1, data channel 2, data channel 3, . . . , data channel N. Each data channel records the waveform of a digital signal applied to its input, e.g. data channel 1 records a corresponding input appearing on lead 1a, data channel 2 records a corresponding input signal appearing on lead 2a and so on. During both recording and playback, each channel provides an output signal equivalent to that which it is presently or has just recorded; specifically, data channel 1 provides an output on lead 1c, data channel 2 provides an output on lead 2c and so on.

All the channels are connected in parallel to a plurality of control lines and buses—specifically lines 101, 103–107, and 109 and 110, and buses 102 and 108—which together emanate from system control 20. As will be discussed in detail later *particularly in conjunction with the embodiment of data channel 1 shown in FIG. 2*, each data channel [is] *may be* connected to a different line in data bus 108. Within system control 20 *as shown in FIG. 1*, each of these lines and buses is driven by circuitry having a sufficiently high drive capability such that a large number of data channels can be connected in parallel without any significant [attentuation] *attenuation* occurring in any of the signals appearing on any of these lines or buses.

System control 20 controls the operation of each of the data channels. Specifically, for recording, each channel independently monitors its associated input signal and, based upon the result of a comparison in logic level (as will be discussed shortly) between the current value of the input signal and that of the most recently stored value, the channel determines whether the current value is to be recorded. In particular, all the channels simultaneously latch respective digital input signals whenever a clock pulse is applied to clock data line 101. The frequency of these pulses is determined by the frequency of the record clock pulses applied to system control 20, via lead 127, from clock 14.

In the event any channel determines that the current value of its input signal is to be recorded, [it] *that channel* provides an appropriate signal to system control 20, via "TAKE" return line 110. In response to this signal, system control 20 applies appropriate pulses (as will be discussed in detail shortly) to "TAKE" data line 109, and record data line 103. These pulses command each channel to simultaneously store the current value of its associated input signal in a memory existing within that data channel at, more specifically, an address (location) specified by the address information then appearing on address bus 102. This address is appropriately incremented by system control 20 such that the next recorded value of each input signal is stored at the next successive location in the memory within each data channel. Furthermore, the time-of-occurrence (commonly referred to as a "time-tag") for each recorded value is stored in a memory within system control 20 at, more specifically, a location having an address corresponding to that of the stored value. This is discussed in greater detail below in conjunction with the discussion of system control 20.

In addition to controlling recording, system control 20 (shown in FIG. 1) also controls playback by all of the channels of the waveform stored in each. Specifically, to replay, i.e., read out the stored waveform to an output of the associated channel, system control 20 applies a train of clock pulses to replay [clock] line 106. The frequency of these pulses is determined by the rate of the replay clock pulses applied to system control 20, via lead 129, from clock 14. The rate of the pulses can be adjusted by the operator to one of many pre-determined integral multiples or fractions of the recording rate, i.e., the frequency of the record clock pulses appearing on lead 127, depending upon the desired speed at which all the recorded waveforms are to be read out of their associated memories and whether that rate is to be faster, the same as or slower than the rate at which will the waveforms were recorded. By adjusting the replay clock pulse rate accordingly, the operator can appropriately expand or compress the time scale of all the recorded waveforms. For example, by appropriately adjusting the replay block pulse rate, a very narrow digital input pulse may be replayed at a sufficiently slow rate to allow an ordinary mechanical pen recorder to make a permanent and accurate record of this pulse. Alternately, where the recorded waveform contains wide variations in frequency, several different replay clock pulse rates can be used in succession in order to appropriately expand or compress the time scale along various points in the recorded waveform.

Coincident with the application of the pulses to replay line 106, system control 20 also applies appropriate address information, via address bus 102, to the memory in every channel. The address information appearing on address bus 102 is appropriately incremented by system control 20 such that all the stored values for each waveform are read out in proper sequence from the respective memories Furthermore, system control 20 permits the operator to set the starting address, at which replay will occur, to correspond to any location in the respective memories. This advantageously permits the operator to replay any desired selected portion of the stored waveforms. For example, if only one particular recorded digital input pulse is of interest and the waveform occurring prior thereto is not, then the address at which replay will start can be set to correspond to the beginning of the desired pulse. Each of the data channels (as discussed in detail shortly) uses a non-destructive random access memory (RAM) to store a recorded waveform which, in turn, advantageously permits the recorded waveform to be replayed as many [time] *times* as desired.

Address indicator 16, which is connected to address bus 102, provides an indication of the current address information present on this bus. Illustratively, address indicator 16 may be comprised of simple well-known combinatorial circuitry which feeds a plurality of display drivers and 7 segment digital displays for converting binary address information on address bus 102 into any convenient desired digital form, such as octal, hex or binary coded decimal (BCD), and then subsequently displaying it. This provides an indication of the current address and thus, by inference, the amount of each memory that has been used (or conversely is available for subsequent storage). A direct indication of the fractional amount of consumed memory space is provided by an alternate address indicator in which the address information is first applied as input to a digital-to-analog (D/A) converter which, in turn, applies its analog output to one of many well-known digital panel meters. By appropriately scaling the output analog voltage range of the D/A to, for example, 0 to +1.6 V, so as to correspond to the lowest and highest locations in memory and appropriately energizing a decimal point on the display such that the display reads 0 to 16.0, then the digital panel meter directly displays the amount of used memory in K that has been used up to that point for waveform storage.

In addition, system control 20, in conjunction with data transfer control 18, permits digital information to be directly transferred between any memory in any data channel or the ("time-tag") memory in system control unit 20 and any external digital device, such as a computer. Specifically, data transfer [unit] *control* 18 is connected to three standard bi-directional digital input/output (I/O) ports: serial data line 24 which is preferably RS-232C compatible, parallel multi-bit bus 25, and general purpose (input/output) interface bus 26 which is preferably compatible with the I.E.E.E. 488 standard. Typically, data transfer control 18 is comprised of a central processing unit (cpu), which is not shown but is illustratively and preferably comprised of any one of a number of presently available and well-known microprocessors, which is connected through commercially available and well-known bi-directional communication circuits (also not shown) to the three I/O ports 24, 25 and 26. To transfer data bi-directionally between any of these ports and the memory in any of the data channels, the cpu is also connected to address and data buses 102 and 108; to system control 20 by control lines 124, 125 and 126; and to each data channel 1, 2, 3 . . . N, by a respective control line 1b, 2b, 3b, . . . , Nb, as well as by write line 104, read line 105 and data direction line 107[,] via leads 111, 112 and 113, respectively. All of these separate control lines from data transfer control 18 form cable 120. All the control lines in cable 120 are connected to standard digital outputs of the cpu. In the present embodiment and within data transfer control 18, the cpu is connected to address bus 102 through unidirectional buffers (not shown) which only permit data transfer control 18 to apply address information onto this bus rather than read address information from this bus.

Figure 2:
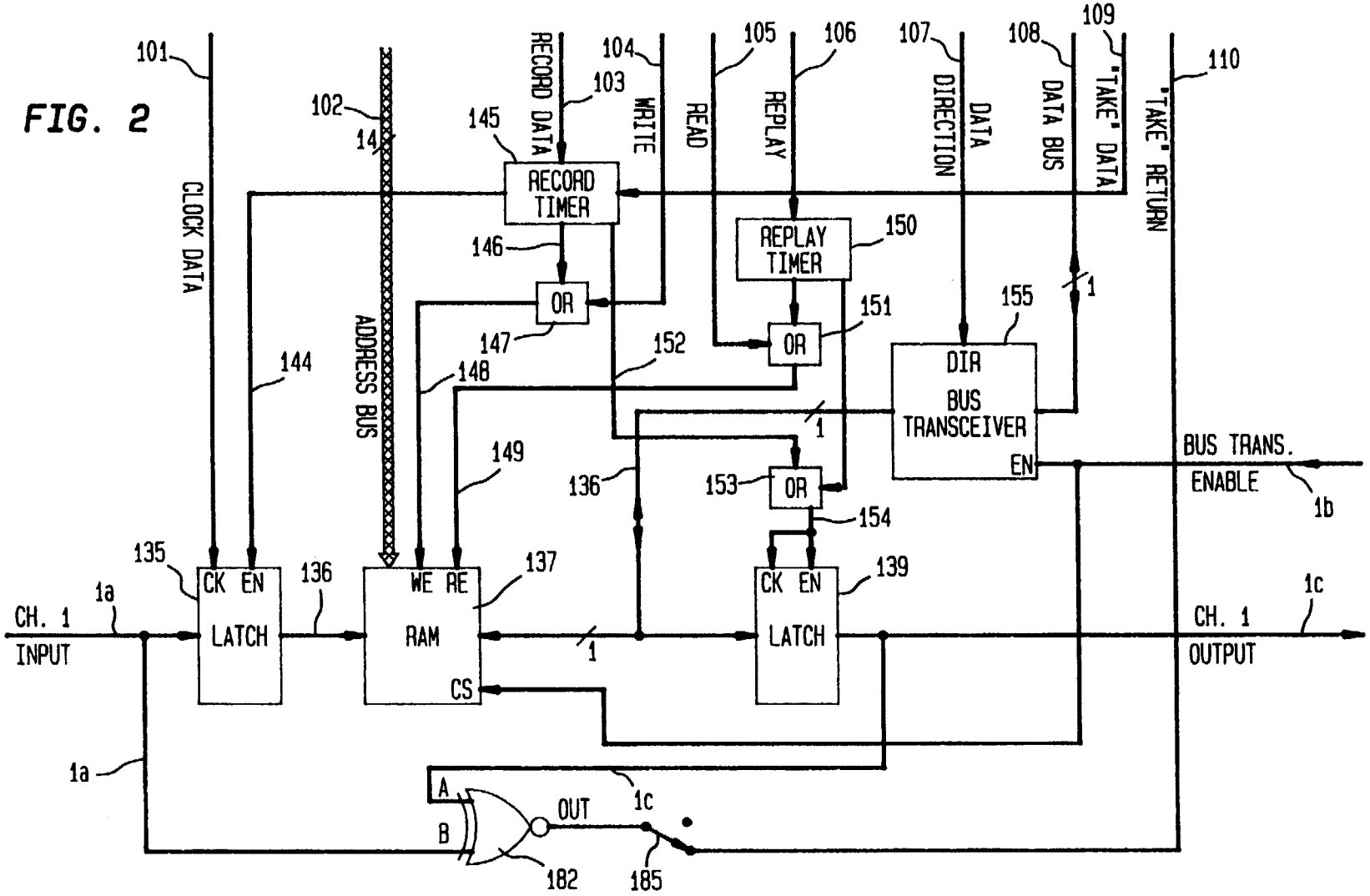
FIG. 2 is a block diagram of the circuitry of data channel 1 shown in FIG. 1.
Figure 3:
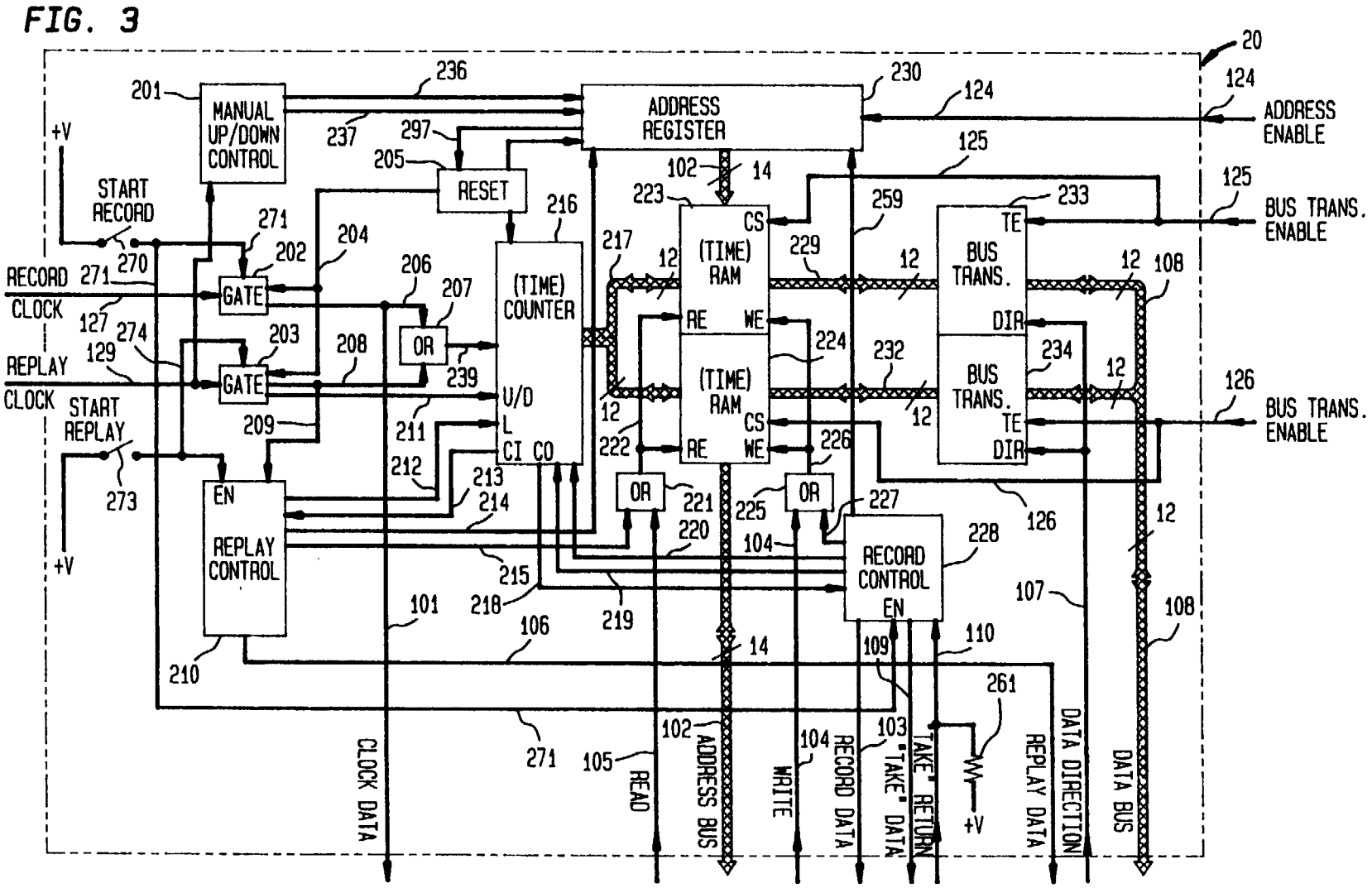
FIG. 3 is a block diagram of the circuitry of system control 20 shown in FIG. 1.

To transfer data to any of [these] ports *24, 25, or 26* from the memory[,] in either system control 20 or in any of the data channels, data transfer control 18 first applies an appropriate level change, via lead 124, to the address enable (AE) input of system control 20. This disables the address generation circuitry and effectively disconnects it from address bus 102. Thereafter, data transfer control 18 applies the appropriate starting address to the address bus. It then applies an appropriate voltage level to data direction line 107, via lead 113. This control line is connected as shown in FIGS. 2 and 3, to various bi-directional bus transceivers, which provide a bi-directional interface between all the RAM memories in all of the data channels and respective lines comprising the data bus, and functions to control the direction of data flow between any of these memories and the respective line on this bus. The level is set such as to permit data to be loaded into a respective line on data bus 108 by any of the RAM memories, via its associated bus transceiver. Once the appropriate level is set on data direction line 107, then the bus transceiver enable (TE) and chip select (CS) lines, associated with the desired RAM memory in either any of the data channels or the system control, are set by data transfer [unit] *control* 18, via the particular line in cable 120, so as to select the desired RAM memory and enable the bus transceiver to transfer data from the selected RAM to the data bus. Since the system control contains two separate [RAM's ] *RAMs*, as previously noted and discussed in greater detail later, and each data channel contains only one *RAM*, two separate TE (and CS) lines, specifically lines 125 and 126, are each connected to a separate RAM memory within system control 20, and one TE (and CS) line, specifically 1b, 2b, 3b, . . . , Nb is connected to the RAM memory within each of the respective data channels 1, 2, 3, . . . , N.

With the desired RAM selected and the appropriate bus transceiver enabled, data transfer control 18 energizes read line 105, via line 112[,]. Read line 105 and write line 104 are both effectively connected, through OR gates as shown in FIGS. 2 and 3, to each RAM memory and thus control the read and write cycles for all the RAM memories. Consequently, with the desired starting address present on the address bus, the appropriate data direction set, the desired RAM selected and the proper bus transceiver enabled, the occurrence of a pulse on the read line initiates a read cycle which results in the stored value in the desired RAM *at the addressed location* being transferred to data bus 108 and from there to data transfer control 18. This value is then either stored locally within the data transfer control or applied as output to one or more of the three I/O ports 24, 25 or 26 depending upon instructions provided to or previously stored within the cpu comprising data transfer [unit] *control* 18. To access values stored at a plurality of locations in the selected RAM, first the address information is incremented and second the data transfer cycle described above is repeated for each such location The sequence for transferring data from any of the I/O ports of data transfer [unit] *control* 18 to any location within a selected RAM memory, occurring within either the system control or any data channel, is very similar to that [describved] *described* above for transferring data from a selected RAM to an I/O port. Transferring information into RAM is particularly useful if the digital waveform recorder is connected to one or more analog recording instruments, e.g. chart recorders, plotters or oscilloscopes. With such a connection, the waveform recorder is converted into a simple digital storage device which can take digital data from any of the three I/O ports, store it and then repetitively display the waveform of the data on the analog recording instrument.

Specifically, to transfer data to a selected RAM memory, data transfer control 18, via lead 124, disables the address generation circuitry within system control 20. Thereafter, the data transfer control applies an appropriate level (opposite to that described above) to data direction line 107, via line 113, to establish the proper direction of data flow through the bus transceivers, i.e., from the data bus to RAM memory. Thereafter, data transfer control 18 applies the appropriate initial address information to address bus 102, and applies the desired data to the appropriate line(s) of data bus 108. Next, data transfer control 18 selects the appropriate RAM memory and enables the appropriate bus transceiver through the associated bus transceiver enable and chip select line. Thereafter, data transfer control 18 applies a pulse to write line 104, via line 111. This pulse initiates a RAM write cycle which stores the desired data in the selected RAM memory at the location specified by this initial address.

As previously noted, the waveform recorder is comprised of a number of independent data channels, each of which records a digital waveform [applied to its input] *associated with a corresponding bit of an incoming multi-bit digital signal*. For the sake of brevity, only one such data channel, specifically data channel 1, will now be discussed. A block diagram of the circuitry comprising this data channel is shown in FIG. 2.

In essence and as noted, this data channel records [an] *the state of* input waveform 171 as a sequence of one-bit digital values] *associated with a bit of the incoming multi-bit digital signal*. Specifically, the data channel periodically latches [the] *this bit of the* digital input waveform at an extremely high speed, then compares the current value of this [waveform] *bit* to a previously (preferably the most recently) stored value and determines if a logical difference exists therebetween. If such a difference exists, then the data channel applies an appropriate control signal to the system control which, in turn, signals the data channel to store the current (new) latched value within the random access memory contained in [that] *this* channel.

In particular, an input waveform (signal) *for the bit* to be recorded is applied over lead 1a to data channel 1. Within the data channel, the input signal is periodically latched at a rate determined by a sequence of clock pulses generated by the system control (see FIG. 1) and appearing on clock data line 101. Each clock pulse is applied to the clock input of latch 135 and causes it to latch the input signal.

In the event the current value, of the input signal applied to data channel 1, is to be recorded, then data channel 1, in a manner to be described shortly, applies an appropriate level change to "TAKE" return line 110. This, in turn, causes the system control to apply an appropriate address to address bus 102 and appropriate pulses to be record data line 103 and "TAKE" data line 109 which together (in a manner also to be described shortly) cause the current value to be stored in RAM memory 137 at a location specified by the address then appearing on the address bus.

Specifically, to determine whether the current value of the input signal on line 1a is to be recorded within RAM memory 137, the logical level of this input signal is continuously compared to the most recently stored value of this signal. To accomplish this, the most recent value stored within the RAM memory is temporarily stored in latch 139. The output of this latch appearing on lead 1c, is applied to one input (the "A" input) to exclusive NOR gate 182. The input signal, appearing on lead 1a, is applied as the other input (the "B" input) to this gate. If any difference in logic levels appears between both inputs, then gate 182 pulls "TAKE" return line 110 low, via switch 185. This low level on the "TAKE" return line signals the system control to instruct each data channel to store the current latched value of each corresponding input signal. Gate 182 is preferably an open-collector type such that the outputs of any reasonable number of these gates can be tied to the "TAKE" return line and any one of these outputs can pull this line down to a low-level. An appropriate "pull-up" resistor 261 is connected to the "TAKE" return line within system control 20, as shown in FIG. 3.

However, if switch 185 is open (opposite position to that shown in FIG. 2), then data channel 1 is not able to select any values of all the input digital signals to be stored but instead only stores the current latched value associated with data channel 1 based upon selections made by any of the other data channels.

At the point when "TAKE" return line 110 is pulled low by the output of NOR gate 182, the system control first applies a pulse to "TAKE" data line 109 ([As shown in] *see* FIG. 4a) followed at illustratively its rising edge by a pulse on record data line 103. Specifically, the pulse on the "TAKE" data line enables record timer 145, shown in FIG. 2. Thereafter, the system control increments the address for each of the RAM memories to the next successive location and outputs this address onto address bus 102. Thereafter, [the] *a* pulse is applied to record data line 103 by the system control. Within the data channel, this pulse is also applied to record timer 145, which, having been enabled by the pulse on "TAKE" data line 109, supplies a pulse, via lead 144, to [the] *an* enable pin *of latch 135* in order to enable the output of *this* latch [135]. As a result of this pulse, latch 135 applies its currently latched value[,] of the input signal[,] to the data inputs of both RAM 137 and latch 139, via lead 136. After an extremely short predefined interval of time has elapsed, i.e., sufficiently long to allow the digital data [an] *on* lead 136 to stabilize, record [time] *timer* 145 applies a pulse via line 152, OR gate 153 and line 154, to both the clock and enable inputs of latch 139. This pulse causes latch 139 to temporarily store the digital data appearing on line 136 and to apply it as output to lead 1c. Essentially at the same time that a pulse is applied to lead 152, record timer 145 also applies a pulse to lead 146. This latter pulse is applied, via OR gate 147 and lead 148, to the write enable (WE) terminal of RAM memory 137 to initiate a write cycle, thereby storing the latched value appearing on lead 136 in the RAM memory.

Display of all the recorded waveforms, as noted before, is effectuated by a series of pulses appearing on replay line 106 which [occur] *occurs* in conjunction with a sequence of incrementing addresses appearing on address bus 102. Specifically, whenever a replay operation is initiated, the system control applies an appropriate starting address to address bus 102. Each address is followed by a pulse applied to replay line 106. Within data channel 1, replay timer 150, in response to the pulse [or] *on* replay line 106, first applies a pulse through OR gate 151 to the read enable (RE) of RAM memory 137, followed a short time later (sufficiently long for the read cycle to occur) by a pulse applied through OR gate 153 and via lead 154, to both the clock and enable inputs of latch 139. This latter pulse causes latch 139 to store the value read from the RAM memory and apply it to output lead 1c. OR gates 147 and 151 are used to supply write and read enable pulses to RAM memory 137 from either to two sources: *from* system control 20, via record [time] *timer* 145 or replay [time] *timer* 150, or from data transfer control 18, via write line 104 and read line 105. To provide sufficient waveform storage, RAM memory 137 is preferably comprised of 16K locations. Since latch 135 provides 1 bit of information, one 16K×1 bit RAM chip, illustratively model number MB8167A manufactured by Fujitsu Limited (Fujitsu) is used *for RAM memory 137*. Since 14 bits is required to access 16K locations, address bus 102 is 14 bits wide.

The MB8167A *RAM chip which is fabricated using* static NMOS [RAM chip] *technology* is suitable for clock rates up to 10 megahertz. With such a clock rate used for the clock pulses appearing on clock data line 101, a pulse having a width of approximately one microsecond can be stored with excellent resolution. To store digital pulses having a shorter pulse width, e.g., on the order of 50 nanoseconds, then the clock rate should be increased to approximately 30 MHZ. For satisfactory operation at this increased rate, RAM memory 137 should be fabricated from a suitable number of emitter-coupled logic (ECL) RAM memory chips, such as model number MCM 10146 manufactured by Motorola Corporation. For extremely high speed operation, latches 135 and 139 may be operated at clock rates of 200 MHz such that a logic level transition as short as 5 nanoseconds can be recorded. Since ECL RAM memories require clock rates much slower than 200 MHZ, pulses as short as 5 nanoseconds in width can advantageously be stored within RAM memory 137 if well-known rotary memory techniques are used to fabricate memory 137. With such techniques, lead 136 is tied in parallel to the input of a number of separate RAM memory chips, and data is successively written into each RAM memory chip in a predefined sequence.

If clock rates in excess of 30 MHZ are used, then ECL type logic should also be used in each data channel for latches 135 and 139, and exclusive NOR gate 182, as well as for various circuits in system control 20 (shown in FIG. 1). Even at these increased clock speeds, the cpu and its associated circuitry[—] *which are both* contained within data transfer control 18, bus transceiver 233 and 234[—] (*see FIG. 3*) *which are* contained within system control 20, and bus receiver 155[—] *which is* contained within data channel 1[—], all need only operate at the maximum speed of the cpu and thus need not be fabricated from ECL circuitry.

As previously discussed, write line 104, read line 105 and data direction line 107 are used to transfer data between any of the three I/O ports, on data transfer control 18 shown in FIG. 1, and RAM memory 137, through initiation of an appropriate write or read cycle involving the memory. Because the digital waveform data stored within each data channel is one-bit wide, only one-bit of information is transferred between the memory and data transfer control 18 at a time. To simplify circuit design and minimize transfer time, each data channel is preferably connected to a respective one of the illustrative twelve lines on data bus 108. With this arrangement, each data channel transfers waveform data to or from data transfer control 18 over only one of the lines comprising data bus 108. Advantageously, since each channel uses a separate line, data can be simultaneously transferred, with appropriate selection of the corresponding bus transceiver enable lines, from any plurality of channels (from two channels to all of them) to or from data transfer control 18.

By now, it is readily apparent that *for, illustratively, channel 1*, a loop circuit has been described in which the output signal on lead 1c (*see FIG. 2*) is continually compared to the input signal on lead 1a to determine when the latched value of the input signal is to be stored. Whenever a logic level difference occurs between these two signals, a "TAKE" data signal causes the system control to [putput] *output* signals which store the latched value and "update" the channel 1 output signal. If, on the one hand, no *such* logical difference exists, then the "TAKE" return signal from NOR gate 182 stays at a high-level (logical [371"] "*1*") state, assuming, of course, that no other channel has caused "TAKE" return line 110 to assume a low-level state. Hence, the one-bit data stored in latch 135 is merely replaced by the next successive latched value. If on the other hand, however, a logical difference occurs, then a low-level signal appears on "TAKE" return 110. This causes *the* latch 135 to latch 139 chain (in each data channel) to continuously update at each successive pulse on record data line 103 until the logical difference disappears and the signal on "TAKE" return line 110 returns to a high level (logical "1") state.

A block diagram of system control 20 is shown in FIG. 3. As previously discussed, the system control provides several functions. First, it determines when each data channel is to latch its associated input signal [and second]. *Second*, in response to a low-level signal on "TAKE" return line 110 caused by any of the data channels, [it] *system control 20* commands all the data channels to record the latched value of all the input signals. System control 20 also controls the replaying of any or all of the waveform data stored within all of the data channels.

To control recording, system control 20 provides a stream of record clock pulses on clock data line 101 which, in turn, is connected to every data channel. These pulses are [generatd] *generated* by clock 14 (shown in FIG. 1) and are first applied, via lead 127, to the data input of gate 202 (*see FIG. 3*) within system control 20. Both [the] gate *202* and record control 228 are turned on and off by operation of switch (*push button*) 270 connected to both units via lead 271. Once enabled, gate 202 applies the record clock pulses to both clock data line 101 and, via lead 206, to an input of OR gate 207. From there, each record clock pulse is then applied over lead 239 to time counter 216 to increment its count by one. This counter is illustratively 24 bits long and is used to count the number of record clock pulses occurring between successively stored values in order *to* generate the appropriate "time-tag" information for each stored value. Each "time-tag" is stored in RAM memories 223 or 224 which together form a 16K×24 bit RAM memory, preferably comprised of 24−16K×1 bit Fujitsu MB8167A RAM chips.

Whenever any data channel determines that the current sample of each waveform should be recorded, that channel, as previously discussed, causes "TAKE" return line 110, which is connected to all the data channels, to assume a low-level (logical "0") state. In response to this low-level state, record control 228 produces a pulse on line 259 to cause address register 230 to increment the address information, appearing on address bus 102, to point to the next successive location in all the RAM memories both within [the] system control 20, as well as within each of the data channels. At essentially the same time, record control 228 also applies another pulse to time counter 216, via lead 220, to cause the counter to output its current contents in parallel to the data input of RAM memories 223 and 224, via bus 217. Since time counter 216 is 24 bits long, bus 217 is 24 bits wide. After a very short interval of time has elapsed, i.e., long enough to allow the data from counter 216 to stabilize on bus 217, record control 228 applies a pulse to the write enable (WE) input of RAM memories 223 and 224, via lead 227, OR gate 225 and lead 226. This OR gate is used to supply a write enable pulse to the RAM, i.e., to initiate a write cycle, from either of two sources: record control 228 or write line 104—*the* latter of which, as shown in FIG. 1, is connected via cable 120 to data transfer control 18. After another short interval of time has elapsed, i.e., sufficient for the write cycle to be completed, reset 205 (*shown in FIG. 3*) applies a pulse to counter 216 to reset its contents to zero. Should the count in time counter 216 overflow prior to recording of any sample, then the counter applies a carry pulse output, via lead 218, to record control 228 which, in response thereto, initiates a recording operation in the same manner as if any data channel placed "TAKE" return line 110 in a low-level state.

In addition, whenever "TAKE" return line 110 assumes a low-level state, record control 228 also provides a low-level (logical "0") signal on "TAKE" data line 109 which is connected to every data channel. This low-level signal causes each data channel to store the current latched value of its associated digital input waveform by initiating, as previously discussed, a write cycle involving the RAM memory existing within the channel. To achieve the functions described above, record control 228 is fabricated from illustratively well-known combinatorial logic gates and flip-flops.

Figure 5:
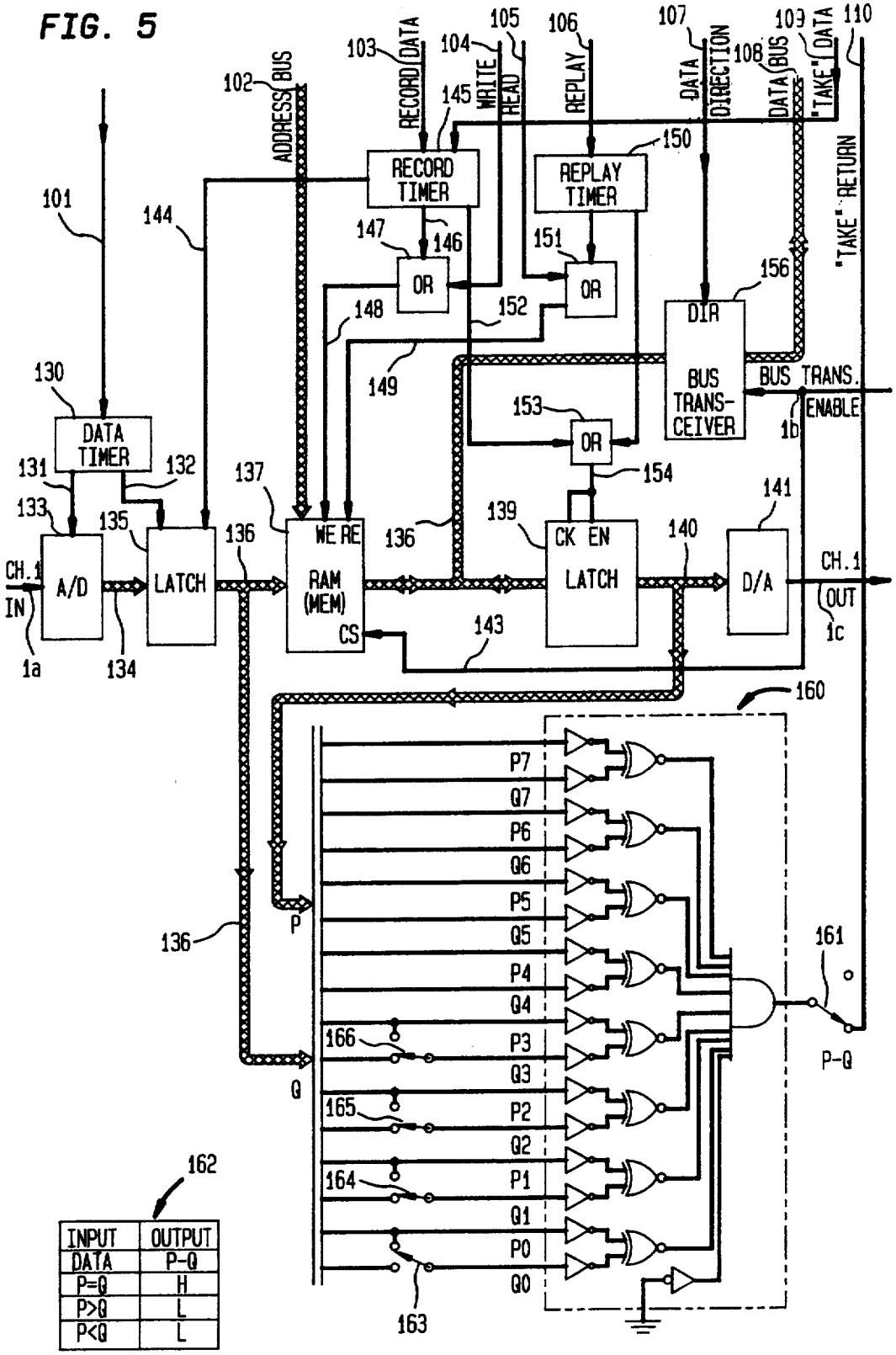
FIG. 5 is a block diagram of a second embodiment of the circuitry of data channel 1 shown in FIG. 1.

Illustrative waveforms of various internal control signals which depict the sequence of operations involved in recording are shown in FIG. 4A. *All the waveforms with the exception of that for the sample/convert signal on lead 131 are applicable to the embodiment of data channel 1 shown in FIG. 2; while all the waveforms including that for the sample/convert signal are applicable to the embodiment of data channel 1 shown in FIG. 5.* As illustratively shown, a latched value is recorded between the occurrence of the first and second, and fourth and fifth [record] clock pulses.

At the conclusion of all recording, i.e., after all 16k locations in each of the RAM memories have been filled with stored data, the entire waveform recorder is automatically reset by reset circuit 206. This circuit (*as shown in FIGS. 3 and 4A*) applies appropriate reset pulses to both time counter 216 and address register 230 to reset their contents to zero, and to gates 202 and 203, via lead 204, to disable their outputs thereby preventing any further record clock pulses *appearing on lead 127* from reaching any of the data channels, via clock data line 101. To provide an indication that all the memory locations have been filled, address register 230 applies an appropriate carry out pulse to reset circuit 205, via lead 297.

System control 20 also controls replaying of the waveform values previously stored within the RAM memory in each of the data channels. To replay previously stored values, clock 14[—], shown in FIG. 1 and previously discussed[—] *above*, applies a stream of replay clock pulses to lead 129. As previously noted, the pulse rate of the replay clock pulses is previously set, by manual controls (not shown) associated with clock 14, to an integral multiple (or fraction) of the pulse rate of the record clock pulses previously applied to lead 127, depending upon the degree of time compression or expansion desired in the replayed waveforms. If narrow digital input pulse waveforms have been recorded, then the replay clock pulse rate is usually chosen to be a small fraction of the record pulse clock rate. In practice, replay clock pulse rates as slow as 1/10,000,000th of the record clock pulse rate can be advantageously selected. Consequently, a recorded digital pulse having a pulse width of 100 nanoseconds can, on playback, be expanded to an illustrative pulse width of 0.1 seconds with a time expansion of 1,000,000 or *to an illustrative pulse width of* 1 second with a time expansion of 10,000,000.

[The] *Within system control 20 shown in FIG. 3, the* replay clock pulses *appearing on lead 129* are applied to the input of gate 203 [within system control 20]. Both [this] gate *203* and replay control 210 are enabled by start replay push button 273. Well-known (not shown) electrical and/or mechanical interlocks exist between start record push button 270 and start replay push button 273 to prevent the recording and replay circuits from being simultaneously enabled. Once enabled, gate 203 applies the replay clock pulses, via lead 208, to an input of OR gate 207 and from there to the clock input of time counter 216, via lead 239. In addition, gate 203 applies these replay clock pulses via lead 211, to the up/down input of counter 216, thereby causing the counter to decrement its present count by one [of] *at* the occurrence of every replay clock pulse. The replay clock pulses are also applied by gate 203 to replay control 210, via lead 209, for purposes of clocking the logic contained therein.

During replay, time counter 216 is loaded—in a manner to be described shortly—with an appropriate "time-tag", associated with each previously stored value, from RAM memories 223 and 224. Each pulse applied by gate 207 to time counter 216, decrements the "time-tag" in time counter 216 by one. Whenever the "time-tag" contained within time counter 216 reaches zero [(indicated by a pulse appearing at its carry in, CI, input)], time counter 216 applies a signal (pulse), via lead 213, to replay control 210. In response to this signal, replay control 210 applies a pulse to replay data line 106, which is connected to all the data channels. This causes each data channel to read out of its respective RAM memory the previously stored value located at the address specified by the address information then appearing on address bus 102, and to present this value to its respective output line.

After a short finite period of time has elapsed—sufficient to permit all the RAM memories within all the data channels to complete their read cycles—replay control 210 applies a pulse, via lead 214, to address register 230 to cause it to increment its address to point to the next successive location in the RAM memories. Thereafter, the incremented address information is applied to address bus 102 and, in turn, to the address input of RAM memories 223 and 224. Replay control 210 then applies an appropriate pulse, via lead 215 and OR gate 221, to cause these RAM memories to read out in parallel the "time-tag" stored at the incremented address. After the read cycle is completed, the "time-tag" information is present on bus 217. After the signals on this bus have stabilized, replay control 210 applies a pulse, via lead 212, to time counter 216 to load the read-out "time-tag" information into the counter. This "time-tag" is then counted down by subsequently occurring replay clock pulses applied to replay clock lead 129. To achieve the functions described above, replay control 210 is fabricated from illustratively well-known combinational logic gates and flip-flops.

As is readily apparent, each value stored within any data channel and its "time-tag" are both recorded simultaneously. In order to replay each waveform in the sequence in which it was recorded, the "time-tag" must first be loaded into time counter 216 and decremented to zero prior to read out of its corresponding stored value in each channel. Hence, to start replay, the first stored value (which incidentally is usually zero) is read out and applied to the output line of that data channel. Thereafter, the "time-tag" associated with the second value is then loaded into time counter 216 for subsequent decrementation. Replay of the remaining stored values occurs according to the sequence described above.

Oftentimes, it may be desirable to start replay at an address which is not zero. To vary the starting address, manual up/down control 201 is fed by the replay clock pulses appearing on line 129. Through various manual adjustments (not shown), manual up/down control 201 applies pulses via leads 236 and 237, to address register 230 to increment or decrement the address contained therein at a rate and direction chosen by [the] *an* operator A pulse on lead 236 changes the contents of the address register, and the level of the voltage on lead 237 species the direction (increment or decrement) of this change.

Bus transceivers 233 and 234—in conjunction with signals appearing on write line 104, read line 105, data direction line 107, address enable line 124 and bus transceiver enable lines 125 and 126—are all used to transfer 24-bit "time-tag" values between the RAM memory within system control 20 (the "time-tag" memory), and any of the three I/O ports associated with data transfer control 18 (shown in FIG. 1). As previously noted, data transfer control 18, prior to the occurrence of any data transfer, applies an appropriate level to address enable line 124, which within system control 20 shown in FIG. 3, is applied to address register 230. This level disables the address register thereby permitting data transfer control 18 to apply suitable address information to address bus 102. Bus transceiver enable lines 125 and 126 are used to enable either one of the bi-directional bus transceivers 233 or 234, respectively, and to select the appropriate RAM memory in order to transfer data between the desired RAM memory 223 or 224 and data bus 108 in a direction determined by the signal then appearing on data direction line 107. Write and read lines 104 and 105, as previously discussed, route respective control pulses generated by data transfer [unit] *control* 18, via corresponding gates, illustratively OR gates 221 or 225 locate within system control 20, to initiate a write or read cycle involving any of these RAM memories.

Illustrative waveforms of various internal control signals which depict the sequence of operations involved in playback are shown in FIG. 4B. For purposes of illustration, the replay clock pulse rate has been chosen to be half that of the record clock pulse rate.

The embodiment of the waveform *recorder* just described utilizes a data channel in which only one bit of data is processed *therein*. This system applies to the handling of *multi-bit* digital signals. FIG. 5 is a block diagram of a second embodiment of a single channel, *e.g. data channel 1*, as shown in system diagram of FIG. 1, which provides an analog data channel with a conversion resolution of 8 bits.

Referring to FIG. 5, this channel [has an] *contains* analog to digital converter 133 which converts input analog signal 1a to an 8 bit word which is transferred to [first] latch 135 via bus 134. The signal is periodically converted and latched at a rate determined by a sequence of clock pulses generated by the system control (see FIG. 1) and appearing on clock data line 101. Each clock pulse is applied to data timer 130 which generates two pulses for each clock pulse. One pulse is in time with the clock pulse and clocks [the] latch 135 to obtain the data at the output of [the] analog to digital converter (A/D) 133. The second pulse is delayed briefly to delay the initiation of the convert of the A/D 133 via line 131. This allows time for the data from the last conversion to be clocked into latch 135 before the A/D starts a new conversion.

In the event the current value of the input signal applied to data channel 1 is to be recorded, then data channel 1, in a manner to be described shortly, applies an appropriate level change to "TAKE" return line 110. This, in turn, causes the system control to apply an appropriate address to address bus 102 and appropriate pulses to record data line 103 and "TAKE" data line 109 which together, in a manner also to be described shortly, cause the current value to be stored in RAM memory 137 at a location specified by the address then appearing on the address bus.

Specifically, to determine whether the current value of the input signal on line 1a is to be recorded within RAM memory 137, the converted logic levels of this signal are continuously compared to the most recently stored corresponding values of this signal. To accomplish this, the most recent values stored within the RAM memory are temporarily stored in latch 139. The output of this latch appearing on bus 140, is applied as one set of input signals to identity comparator 160 at bus input [p] *P*. The input signal converted to digital information, appearing on bus 134, and held in latch 135 with output on bus 136 is applied to the other set of inputs Q of identity comparator 160. If any difference in logic levels appears between both sets of inputs, then output P-Q pulls "TAKE" return line 110 low, via switch 161. This low level on the "TAKE" return line signals the system control to instruct each data channel to store the current latched values of each corresponding input signal. Identity comparator 160 preferably has an open collector type output such that the outputs of any reasonable number of these comparators can be tied to the "TAKE" return line and any one of these outputs can pull this line down to a low-level. An appropriate "pull-up" resistor 261 is connected to the "TAKE" return line within system control 20, as shown in FIG. 3.

However, if switch 161 is open (opposite position to that shown in FIG. 5), then data channel 1 is not able to select any values of all the input signals to be stored but instead only stores the current latched values associated with data channel 1 based upon selections made by any of the other data channels.

At the point when "TAKE" return line 110 is pulled low by the output of comparator 160, the system control first applies a pulse to "TAKE" data line 109 (as shown in FIG. 4A) followed by illustratively its rising edge by a pulse on a record data line 103. Specifically, the pulse on the "TAKE" data line enables record timer 145, shown in FIG. 5. Thereafter, the system control increments the address for each of the RAM memories to the next successive location and outputs this address onto address bus 102. Thereafter, the pulse is applied to record data line 103 by the system control. Within the data channel, this pulse is also applied to record timer 145, which, having been enabled by the pulse on "TAKE" data line 109, supplies a pulse, via lead 144, to the enable pin *of latch 135* in order to enable the output of *this* latch [135]. As a result of this[,] pulse, latch 135 applies its currently latched value, of the digital value of the input signal, to the data inputs of both RAM 136 and latch 139, via bus 136. After an extremely short predefined interval of time has elapsed, i.e., sufficiently long to allow the digital data on bus 136 to stabilize, record [time] *timer* 145 applies a pulse via line 152, OR gate 153 and line 154, to both the clock and enable inputs of latch 139. This pulse causes latch 139 to temporarily store the digital data appearing on bus 136 and to apply it to digital-to-analog converter (D/A) 141, which converts the digital signal to an analog signal. The analog signal appears as *an* output on line 1c. Essentially at the same time that a pulse is applied to lead 152, record timer 145 also applies a pulse to lead 146. This latter pulse is applied, via OR gate 147 and lead 148, to write enable (WE) terminal to RAM memory 137 to initiate a write cycle, thereby storing the latched value appearing on lead 136 in the RAM memory.

Display of all the recorded waveforms, as noted before, is effectuated by a series of pulses appearing on replay line 106 which [occur] *occurs* in conjunction with a sequence of incrementing addresses appearing on address bus 102. Specifically, whenever a replay operation is initiated, the system control applies an appropriate starting address to address bus 102. Each address is followed by a pulse applied to replay line 106. Within data channel 1, replay timer 150, in response to the pulse on replay line 106, first applies a pulse through OR gate 151 to the read enable (RE) of RAM memory 137, followed a short time later—sufficiently long for the read cycle to [occurr] *occur*—by a pulse applied through OR gate 153 and via lead 154, to both the clock and enable inputs of latch 139. This latter pulse causes latch 139 to store the value read form the RAM memory and apply it to the output D/A 141 which converts the digital signal to an analog signal which is output on lead 1c. OR gates 147 and 151 are used to supply write and read enable pulses to RAM memory 137 from either of two sources: *from* system control 20, via record timer 145 or replay [time] *timer* 150, or from data transfer control 18, via write line 104 and read line 105. To provide sufficient waveform storage, RAM memory 137 is preferably comprised of 16K locations. Since latch 135 provides 8 bits of information in this second embodiment, eight 16K×1 bit RAM chips are used *to fabricate RAM memory 137*. Since 14 bits is required to access 16K locations, address bus 102 is 14 bits wide. To handle the 8 bits of data, bus 108 is 8 bits wide. This requires that the data being transferred on data bus 108 be handled one channel at a time. Control bus 120 provides individual control lines to provide individual control of bus transceiver [155] *156* when transferring data on data bus 108.

In channel 1 of FIG. 5, the loop circuit used to control the storing of data comprises [the latch 135—the source of input data, the data] *bus 134, latch 135,* bus 136, [the] RAM 137, [the bus 136 connecting to the second] latch 139, [and the data] bus 140 [connecting to], *and* identity comparator 160. The [inputs] *outputs* from latch 139 are connected to the P inputs of comparator 160, while the input data [from] *to* latch 135 [are] *is* connected, *via bus 136,* to the Q inputs of comparator 160. The logic table 162 for the identity comparator [chip] 160 requires that all *corresponding* P and Q [corresponding] inputs be the same for an output of logical "1" (*high*). If, on the one hand, no difference *between the P and Q inputs* exists, then the "TAKE" return signal on line 110 stays at a high level (logical "1") state—assuming, of course, that no other channel has caused "TAKE" return line 110 to assume a low-level state. Hence, the 8 bit data stored in latch 135 is merely replaced by the next successive converted and latched value. If on the other hand, however, a logical difference occurs in any of the 8 bit pairs (*corresponding* P and Q *inputs*), then a low-level signal appears on "TAKE" return line 110. This *low-level signal* causes *the* latch 135 to latch 139 chain (in each data channel) to continuously update at each successive pulse on record data line 103 until the logical difference disappears and the signal on "TAKE" return line 110 returns to a high level (logical "1") state.

The input data on line 1a is clocked by [the] clock data line 101 via data timer 130. The data timer 130 outputs a pulse on line 132 in time with the pulse on line 101 to latch data already at the output of A/D 133. A very short precise time after the data has been clocked into latch 135, data timer 130 outputs a second pulse on line 131 to start the conversion process of A/D 133. When the conversion is complete, the output of A/D 133 is updated and held available until it is latched by latch 135 on the next clock data pulse on line 101 and the associated conversion begun via a pulse on line 131.

An important feature of this second embodiment is the available selection of the difference level in analog signals between input and output at which new data will be stored in memory as digital information. Switches 163 through 166 in order connect the signals Q to the Q inputs of the identity comparator 160 or in their alternate position connect the Q inputs to their respective P inputs. As shown, switch 163 has inputs P and Q shorted together. In this position the inputs Po and Qo are always the same and this least significant bit does not contribute to the data selection. The data is then selected on the basis of the 7 most significant bits. Placing all switches 163 through 166 in the P-Q shorting position causes the identity comparator 160 to compare only the 4 most significant data bits. Thus, the difference which must exist before new data will be stored in RAM 137 is controlled by switches 163 through 166. Advantageously, each channel may be adjusted to operate at different sensitivities of data selection, since each data channel has independent switch sets 163 through 166.

The operation of system control 20 with the second embodiment of FIG. 5 is the same as described before for the first embodiment of *data channel 1 shown in* FIG. 2.

As can be readily appreciated from the foregoing description, an electronic waveform recorder embodying the principles of the present invention is not only readily able to accurately record a plurality of frequently occurring waveforms having relatively wide pulse widths or frequencies, but advantageously it can also accurately and automatically record extremely narrow digital pulses (having illustrative pulse widths by the order of nanoseconds) that infrequently occur over exceedingly wide intervals which can range over many orders of magnitude. This recorder can advantageously replay a recorded waveform any number of times and at any speed that is a multiple or fraction of the speed at which the waveform was originally recorded. The use of slowly frequency playback advantageously permits any low speed mechanical waveform recorder or other analog device, e.g., a chart recorder, plotter or an oscilloscope, to be used as a graphic output device. Moreover, by appropriately varying the replay clock pulse rate, any desired amount of time compression or expansion can be achieved for playback. Thus, an electronic waveform recorder embodying the teachings of the present invention can effectively function as an interface (and/or buffer) between a plurality of high speed signals and [,] low speed mechanical recorders by providing a vehicle through which these recorders can mechanically record a plurality of signals having pulse widths far shorter than that which can be accurately recorded by these mechanical recorders.

In addition, the basic parallel interconnection of all the data channels readily permits an electronic waveform recorder, embodying the teachings of the present invention to be readily and inexpensively [expended] *expanded* to record any number of input digital waveforms by the simple connection of an additional number of data channels and, in the first digital embodiment, appropriate expansion of the data bus. The various circuits which supply signals to these data channels must, of course, possess sufficient drive capability to handle the desired number of interconnected data channels.

Furthermore, the electronic waveform recorder can be implemented using microprocessor technology in which the system control is embodied in one microprocessor and its peripheral chips, and each data channel is comprised of a comparison and storage loop formed from discrete digital circuitry and a microprocessor to handle communications. Alternatively, any one of a number of commercially available single chip microprocessors could be used for the entire circuitry of each data channel provided that the microprocessor can be operated at sufficient speed in view of that of the input when digital data is to be recorded.

Although specific illustrative embodiments have been shown and described herein, this merely illustrates the principles of the present invention. Many varied arrangements may be devised by those skilled in the art without departing from the spirit and scope of the invention.

What is claimed is:

[1. A signal controlled waveform recorder having a plurality of data channels for recording selected portions of the signals supplied to the data channels of said recorder, said recorder comprising;

(a) latch means for each of said plural data channels, each being responsive to an assigned data input signal and a clock pulse to provide latch values of the assigned data input signals;

(b) means for producing digital output signals having substantially the same logical values as those of previously stored values of said input signals;

(c) means for comparing the logical values of said input signals and said digital output signals and producing control signals responsive to any logical differences occurring therebetween; and (d) means responsive to said control signals for storing in parallel the latched values of said input signals.]

[2. The invention of claim 1 wherein said recorder further includes means for storing a time-tag value representing the time of occurrence of an associated latch value stored in said data channels.]

[3. The invention of claim 2 wherein said waveform recorder further comprises means connected to each of said data channels and responsive to the control signal generated by any of such data channels for causing at least one of said data channels to store the latch value associated therewith.]

[4. The invention of claim 3 wherein said waveform recorder is further comprised of means for reading any of the latch values stored in any one of the data channels and for providing a digital output signal in response thereto.]

[5. The invention of claim 4 wherein said reading means is further comprised of means for selectively setting the rate at which any of the stored latch values are read to a desired integral multiple or fraction of the rate at which this latched value was stored.]

[6. The invention of claim 5 wherein said reading means is further comprised of means for accessing the stored value representing the time of occurrence associated with a desired latch value stored within at least one of the data channels, and means for counting the accessed value to substantially zero prior to causing said one data channel to read the desired latch value.]

[7. The invention of claim 6 wherein said reading means is further comprised of a plurality of input/output ports and means connected to said data channels and to said ports for transferring information there between.]

[8. The invention of claim 7 wherein said comparing means comprised gating means responsive to said input signal and said digital output signal for generating said control signal.]

[9. A signal controlled waveform recorder in accordance with any of claims 1–8 wherein the input signal is digital.]

[10. A signal controlled waveform recorder in accordance with any of claims 1–8 wherein the input signal is an analog signal.]

[11. A signal controlled waveform recorder having a plurality of data channels for recording selected positions of analog electrical input signals, said recorder comprising:

(a) analog to digital converter means responsive to said analog input signal to provide a plurality of digital bits representative of the analog signal amplitudes;

(b) means responsive to said plurality of digital bits and a clock pulse signal providing a latch value substantially equivalent to the values of said analog input signals at the time of the clock pulse signal;

(c) means for producing a digital output signal having substantially the same logical value as those of previously stored values of said analog input signals;

(d) means for comparing the logical values of said latched digital signals and digital output signals and producing control signals responsive to any logical difference therebetween; and (e) means responsive to said control signals for storing in parallel the latch values representative of said analog input signals.]

[12. The invention of claim 11 wherein said recorder further includes means for storing in parallel time-tag values, representing the time of occurrence of an associated latched value stored in said data channels.]

[13. The invention of claim 12 wherein said waveform recorder further comprises means connected to each of said data channels and responsive to the control signal generated by any of such data channels for causing at least one of said data channels to store the latched value associated therewith.]

[14. The invention of claim 13 wherein means are provided for playback of said recorded latch values.]

*15. The signal controlled waveform recorder having a plurality of data channels for recording selected portions of a corresponding signal supplied to each one of the data channels, said recorder comprising:*

*means, associated with each one of said data channels and responsive to a corresponding one of a plurality of input signals and a clock pulse, for providing a corresponding one of a plurality of digital signals, wherein each of said digital signals corresponds to an associated one of said input signals and has a value substantially equal to a previously occurring value of said one input signal;*

*means for comparing substantially current values of said input signals with the values of said digital signals and producing a control signal in response to at least one pre-defined logical difference, said difference occurring between one of said input signals and a corresponding one of said digital signals; and*

*means, responsive to said control signal and to the digital signals, for storing in parallel a set of simultaneously occurring values of all of said digital signals, wherein each value in said set is a current value of a different corresponding one of said digital signals.*

*16. The waveform recorder of claim 15 further comprising means, responsive to said control signal, for storing a "time-tag" value which represents a time at which the values of the digital signals that form said set simultaneously occurred.*

*17. The waveform recorder of claim 16 further comprising means, connected to said storing means, for accessing a desired set of the simultaneously occurring values of all the digital signals that have been stored within all of said data channels and routing each stored value in said accessed set to an associated output lead as part of a corresponding digital output signal.*

*18. The waveform recorder of claim 16 wherein each of said data channels comprises:*

*a memory;*

*latch means, responsive to a corresponding one of said input signals and to said clock pulse, for providing the previously occurring value of said corresponding one input signal as a corresponding one of said digital signals;*

*means, responsive to said corresponding one of said input signals and to said corresponding one of said digital signals, for comparing the substantially current value of said corresponding one input signal to said previously occurring value thereof to detect a difference therebetween and for generating a first control signal whenever said difference is detected;*

*means, connected to said memory and responsive to a second control signal, for instructing the memory to store the previously occurring value of said corresponding one input signal therein; and*

*wherein said waveform recorder further comprises:*

*a control circuit, responsive to the first control signal generated by any of said data channels, for producing said second control signal to all of said data channels so that each data channel will simultaneously store a corresponding different one of said simultaneously occurring values of said digital signals, whereby all of said data channels will collectively store a next successive set of most recent simultaneously occurring values of all of the digital signals.*

*19. The waveform recorder in claim 18, wherein each of said data channels further comprises means, connected to said comparing means, for selectably preventing said first control signal generated by said comparing and generating means situated within said data channel from reaching said control circuit.*

*20. The waveform recorder of claim 18 wherein said comparing and generating means in each of said data channels comprises a gate, responsive to said corresponding one of said input signals and to the corresponding digital signal, for comparing the values thereof and generating said first control signal.*

*21. The waveform recorder of claim 18 wherein said latch means further comprises first and second serially connected latches wherein an output of said first latch is connected to said memory and an output of said second latch is connected to said comparing and generating means, and said instructing means comprises:*

*means for enabling said first latch to store a substantially current value of said corresponding one input*

*signal for a clock interval as said previously occurring value of said corresponding one input signal; and*

*means for causing the previously occurring value of said corresponding one input signal to be stored in said second latch and said memory.*

*22. The waveform recorder of claim 18 wherein said "time-tag" value storing means is contained within said control circuit, and said control circuit further comprises:*

*means for accessing a stored "time tag" value from said "time-tag" value storing means; and*

*means for counting the accessed "time-tag" value to substantially zero prior to causing each one of all of said data channels to access a corresponding value within the desired set of said stored digital signal values from the memory contained in each of said data channels.*

*23. The waveform recorder of claim 22 wherein said control circuit further comprises means, connected to each of said data channels, for generating an address at which a corresponding value of each one of said digital signal values in said desired set is stored within the memory in each of the data channels and for applying said address to the memory situated within each of said data channels.*

*24. The waveform recorder of claim 23 wherein said control circuit further comprises means, connected to each of said data channels, for providing a third control signal to each of said data channels to access the desired set of the values of the digital signals stored within all of said data channels; and wherein each of said data channels further comprises means, connected to the memory in said each data channel and responsive to said third signal, for causing all of the memories in all of the data channels to substantially simultaneously access said desired set of the values of the digital signals.*

*25. The waveform recorder of claim 24 further comprising means, connected to said control circuit, for selectively setting a rate at which a plurality of sets of simultaneously occurring values of the digital signals are accessed to a desired integral multiple or fraction of a rate at which these sets were stored.*

*26. The waveform recorder of claim 18 wherein said control circuit means further comprises:*

*a plurality of input/output ports; and*

*means connected to each of said data channels and to each of said ports for transferring information between any of said data channels and any of said ports.*

*27. The waveform recorder of claim 18 wherein each of the input signals is a one-bit digital signal.*

*28. The waveform recorder of claim 18 wherein an analog input signal is applied to a selected one of the data channels, and the selected one of said data channels further comprises an analog-to-digital converter for converting said analog input signal to a substantially equivalent multi-bit digital value and for providing said equivalent multi-bit digital value as an input signal to the latch means contained within said selected channel.*

*29. The waveform recorder of claim 28 wherein said selected one of said data channels further comprises means, responsive to the current value of said corresponding one input signal and the previously occurring value thereof, for specifying bits of both said corresponding one input signal and the corresponding previously occurring value thereof that are to be compared by said comparing means.*

* * * * *